United States Patent
Dausmann (10) Patent No.: US 8,810,766 B2
(45) Date of Patent: Aug. 19, 2014

(54) METHOD AND DEVICE FOR PRODUCING CONTACT COPIES

(75) Inventor: Günther Dausmann, Grassbrunn (DE)

(73) Assignee: Hologram Industries Research GmbH, Pliening-Ottersberg (DE)

( * ) Notice: Subject to any disclaimer, the term of this patent is extended or adjusted under 35 U.S.C. 154(b) by 109 days.

(21) Appl. No.: 13/640,049

(22) PCT Filed: Apr. 7, 2011

(86) PCT No.: PCT/EP2011/055420
§ 371 (c)(1),
(2), (4) Date: Oct. 9, 2012

(87) PCT Pub. No.: WO2011/124641
PCT Pub. Date: Oct. 13, 2011

(65) Prior Publication Data
US 2013/0027678 A1 Jan. 31, 2013

(30) Foreign Application Priority Data

Apr. 9, 2010 (DE) .................. 10 2010 014 305

(51) Int. Cl.
| G03B 27/06 | (2006.01) |
| G03H 1/20 | (2006.01) |
| G03F 7/20 | (2006.01) |
| G03H 1/04 | (2006.01) |
| G03H 1/02 | (2006.01) |

(52) U.S. Cl.
CPC ........... *G03H 1/202* (2013.01); *G03H 2270/23* (2013.01); *G03H 2270/31* (2013.01); *G03H 2001/0473* (2013.01); *G03H 2227/04* (2013.01); *G03H 2001/0415* (2013.01); *G03F 7/7035* (2013.01); *G03H 1/0248* (2013.01); *G03F 7/70408* (2013.01)
USPC .......... 355/2; 355/67; 355/72; 355/78; 359/12

(58) Field of Classification Search
CPC ....... G03F 7/0037; G03F 7/12; G03F 7/2014; G03F 7/70283; G03F 7/7035; G03F 7/70408; G03F 7/70791; G03H 1/04; G03H 1/0402; G03H 1/20; G03H 1/202; G03H 2001/0232; G03H 2001/04–2001/0415; G03H 2001/20; G03H 2227/04; G03H 2227/05; G03H 2270/20; G03H 2270/23
USPC ............ 355/2, 64, 67, 72, 75, 77, 78, 85, 86, 355/90, 103, 104, 108–111; 359/1, 12, 35
See application file for complete search history.

(56) References Cited

U.S. PATENT DOCUMENTS

| 4,973,113 A | 11/1990 | Harrington et al. |
| 5,085,514 A | 2/1992 | Mallik et al. |
| 5,576,853 A | 11/1996 | Molteni et al. |
| 6,055,075 A | 4/2000 | Nishikawa |
| 8,382,463 B2 | 2/2013 | Oliveira et al. |

FOREIGN PATENT DOCUMENTS

| DE | 102007042385 | 3/2009 |
| EP | 0726142 | 8/1996 |
| JP | 5249876 | 9/1993 |
| JP | 5249877 | 9/1993 |

*Primary Examiner* — Colin Kreutzer
(74) *Attorney, Agent, or Firm* — Mark M. Friedman (57) ABSTRACT

A method and a device are described for producing copies/replica of a volume reflection hologram wherein a holographic film (4) is guided over a drum with polygon cross-section having at least two planar (polygon) master surfaces (3) to each of which at least one master (7) is attached in the circumferential direction, where the film is brought into contact with at least one master hologram (7) and its entire surface is exposed to laser. It is essential that to at least one of the master surfaces (5) with the film guided over it, a laser exposure unit (22) is assigned which allows full exposure of the respective master surface to parallel, coherent laser beams (6), and that the at least one exposure unit (22) follows section wise the rotational movement of the drum by a splitting angle with equal velocity and exposes the corresponding master surface (5) to then be reset quickly again and perform the same angular displacement and exposure together with the next master surface. In this manner, a highly productive multiplication even of large reflection holograms in high quality is possible.

14 Claims, 5 Drawing Sheets

METHOD AND DEVICE FOR PRODUCING CONTACT COPIES

The invention refers to a method and a device for producing contact copies of reflection volume holograms according to the preamble of claim 1 or claim 7, respectively.

From DE 198 09 502 A1, it is known to produce contact copies of a reflection volume hologram by fixing a master hologram to a flat bed, impressing a holographic film onto the master and then exposing the film. To avoid local tensions in the film, a certain waiting time must be respected after the film has been impressed onto the master hologram. To achieve a fast serial production with large numbers of items, buffer zones are to be provided in which the film remains for the required waiting time of approximately 4 to 5 seconds before the hologram is exposed in its entirety for reproduction of the master hologram in the photopolymer layer of the film.

The procedure is similar for the production of reflection holograms large amounts of which are required in particular in security elements. For producing a reflection hologram, a transparent master hologram is placed on a reflecting photopolymer film or a photopolymer film with a reflecting substrate so that a contact copy of the master hologram is produced.

From the above-mentioned DE 198 09 502 A1 as well as from EP 0 726 142 B1, JP 05 249 877 A and JP 03 148 687 A, it is known inter alia to fix at least one reflection master hologram on a rotating drum for copying/duplicating reflection holograms. For this process, a photosensitive film is continuously placed over the master holograms fixed on the drum and is guided in motion together with it and exposed by laser. For exposure, a transversely linearly widened convergent laser beam is used which linearly impinges on the curved surface to be exposed in a respective reconstruction angle of e. g. 45° (because of the Bragg reflection). Therefore, a specific, relatively long exposure time for polymer exposure is necessary until the master with the film placed on it is exposed along the entire circumferential length. Thus, for large surface holograms a relatively large amount of time is necessary which, of course, also leads to high expenses. On the one hand, a faster rotation of the drum could result indeed in higher productivity; this leads however to an impairment of the quality of the copies or replica obtained.

Finally, from JP 05-249 876 A, a method for producing holograms is known where a film is guided over a rotating polygonal drum, preferably a square drum, where to each of the planar polygonal surfaces one master hologram is attached. The drum is rotated intermittently in steps such that in case of a standstill, one master surface with the master hologram attached to it is located in its entirety within the planar exposure area of a divergent laser beam. Due to divergence of the exposure beam which impinges on the entire area at a predefined angle, particularly in case of the exposure of large master holograms, the incidence angle, and thus the reconstruction angle, are not identical over the entire length and/or width of the master so that the copy or reconstruction, respectively, are not identical over the entire surface either, substantially impairing the quality of the copy.

Therefore, the aim of the invention is to provide a method and a device of the type mentioned above which allow an increase in productivity also in the manufacturing of large holograms, while maintaining a high and uniform copying quality.

This aim is achieved by a method having the features of Claim 1 and by a device with the features of Claim 7. Advantageous embodiments and further developments of the invention are revealed by the respective dependent claims.

According to the invention, the drum is rotated uniformly, with at least one respective entire polygonal surface (master surface) with the master placed on it being positioned within the exposure area. Thereby, the respective laser exposure is a coherent parallel radiation which occurs on the entire master surface or the surface of the respective masters of a master surface or several master surfaces at the same time.

The envisaged exposure of the hologram in the continuously rotating movement of the drum or of the film, respectively, by a laser beam exposing thereby the entire surface, a continuous process is made possible by means of which relatively long webs of films and/or relatively large master holograms can also be easily exposed and thus reproduced uniformly and economically.

It is particularly advantageous that one entire master surface or two or more master surfaces can be exposed to laser at the same time, e.g. in case of an octagonal polygon with eight masters, four or more masters simultaneously. The productivity of the method according to the invention is accordingly high.

If in addition, more than one hologram is fastened to a planar master surface, this additionally increases productivity accordingly. The prices for such replica will then become "affordable" as well.

For avoiding that at the respective polygon corners, between the active master surfaces, the film possessing a certain elasticity arches outward and is detached from the drum, it is advantageous to provide a pressing device, e. g. a mechanically, pneumatically, hydraulically, electrically or magnetically operated pressure roller or cylinder or a pressure roller or cylinder operated by a combination of the foregoing, acting from the outside, and/or a vacuum (negative pressure) acting from the inside. In this manner, close adhesion of the film also over the corners or edges of the drum polygon and thus a precise guidance of the film over or with the master surfaces, respectively, are achieved.

In another variant, the pressure cylinder can be mounted eccentrically, e. g. on a spring-loaded mounting, such that it compensates for the radial strokes caused by the polygon corners of the drum. In this manner, a constant pressure of the roller is maintained since now the spring no longer has to compensate for the roller stroke over its entire length.

It is also envisaged that with each rotation of the drum, the eccentric pressure cylinder is lifted, e. g. by levers with a lifting roller at their ends, which levers travel at the front face of the drum and cooperate with eccentric bolts of the pressure cylinder, extending downwards on both sides, so that the circular tolerance is compensated for.

To achieve a uniform complete exposure of the master surfaces, and thus of the holograms attached to them, even with a continuously rotating polygon drum, the invention proposes to shift and/or to swivel (or to swivel along) the exposure source stepwise in accordance with the drum motion. This is done in particular by corresponding movement or swiveling of the mirror guiding the copying laser beam, e. g. at least of the last mirror, possibly a concave mirror.

If several master holograms are arranged on a planar master surface, it is an advantage if the (inner) circumferential distances between the masters of a surface and the (outer) distances between the masters of directly adjoining master surfaces are identical over the polygon corners. In this manner, holograms with uniform distances between them are created on the film so that exposure and for this reason copying per se and further subsequent processing after delamination of the film from the drum can take place in a very precise manner, with minimal losses.

To achieve complete exposure with coherent beams of the master surfaces, according to the invention, the laser beam can be directed, as divergent radiation, over a first mirror towards a correspondingly formed concave mirror and from the latter towards the master surface as a parallel radiation at the necessary angle. However, two deflecting mirrors can also relay a parallel radiation accordingly.

The device according to the invention, which is used to perform the process described above, comprises in particular a polygonal drum with at least two planar (polygon) master surfaces for entraining the film and for making the film contact the respective at least one master hologram attached to the respective master surface, as seen in the circumferential direction, where it is of importance that at least one respective coherent laser light source is assigned to one master surface for exposure of its entire surface. In addition, a drive mechanism for constant simultaneous movement of the drum, and thus of the multiple master holograms attached to it and of the holographic film, is provided. In addition, naturally, at least one first and one second contact roller (guide and/or tensioning roller) for making the master hologram contact the film (lamination and delamination) are arranged, so that all in all, optimum lamination, transport, laser exposure and delamination of the film, and thus copying even of large holograms, are possible.

Finally the at least one exposure unit is designed such that it follows, section wise, the constant rotational movement of the drum with equal speed, as far as the necessary exposure time for the corresponding master surface requires this. Then the exposure unit is quickly reset again to the initial position so as to perform, together with the next master surface, the same angular displacement in the rotational direction of the drum and the necessary exposure of the entire surface.

It is apparent that this device is structured in a simple manner so as to save a large amount of space and that it is effective and achieves surprising results. With this device, it is now possible to quickly produce replica of large holograms very economically and in very high quality and large numbers.

As has been stated already, the cross-section of the polygon drum according to the invention can have different shapes with at least two planar master surfaces. Thus, in cross-section, the drum can be, among others, a flat rectangle with two master surfaces parallel to each other, an equilateral triangle with three master surfaces, a square with four master surfaces or a pentagon, hexagon, heptagon, octagon or, in general, a polygon with a corresponding number of master surfaces. The film is guided in a manner to allow copying over at least one, preferably two to n−1 master surfaces, representing active master surfaces, where one or more exposure units can be assigned to the active master surfaces at the same time.

Thus, for example, in case of an octagon drum, four active master surfaces can be present, where the film is guided or entrained, respectively, over four of the eight master surfaces such that at least one of these surfaces can be optimally exposed to laser, as required, and so that even two or four surfaces can be exposed at the same time. Thereby the possibility is given to expose all four active master surfaces at the same time. The advantage of the latter variant is that sufficient time remains for resetting the four exposure units in an organized manner.

It is also advantageous to provide the envisaged pressing device e. g. with a mechanically, pneumatically, hydraulically, electrically or magnetically operated pressure roller or cylinder or a pressure roller or cylinder operated by a combination of the foregoing, acting from the outside, and/or a vacuum (negative pressure) acting from the inside. This ensures that the film, which is elastic yet has a certain spring stiffness, is attached sufficiently close at the polygon corners over which it is guided or placed and does not deflect outwardly in a larger radius than that of the corners and thus does not "bulge". This can especially be the case with a polygon drum having a low number of surfaces, e. g. if only three surfaces are present, leading to a triangular cross-section, since acute corner angles of only 60° are present in this case. The larger the number of surfaces, the larger the corner angles and the easier/simpler it is to achieve the close attachment of the film. With an octagon, for instance, the corner angles have 145°, allowing an optimum attachment, even without additional pressing device.

A particularly advantageous, constant pressing pressure is achieved if the spring-loaded pressure cylinder is mounted eccentrically, so that the radial stroke caused by the polygon corners during drum rotation is compensated for by the pressure cylinder and not only by the length of the spring. At the same time, the circular tolerance can be compensated for if the pressure cylinder is lifted at least slightly with each rotation of the drum by means of respective levers provided at the front side and a lifting roller fastened to their ends.

Furthermore, it is possible for the exposure unit to have at least one adjustable deflecting mirror which during the continuous rotation of the drum performs a corresponding swiveling movement with identical angular velocity, as has been described above.

In addition, the exposure unit can comprise at least one last mirror which delivers parallel beams to the master exposure, where in case of two mirrors being present, the first mirror delivers a divergent radiation and the second one, a concave mirror, transforms this radiation into parallel coherent radiation with full exposure.

Finally, there is the possibility of embodying the master drum as a magnetic drum or a drum equipped with magnetic elements. In this manner, for instance, the pressing devices, such as pressure rollers, and/or the lamination and delamination rollers or cylinders can also be equipped magnetically, so as not to require additional pressing devices.

In the following, the invention will be explained more closely by means of several embodiments with reference to the figures wherein.

Figure 1:
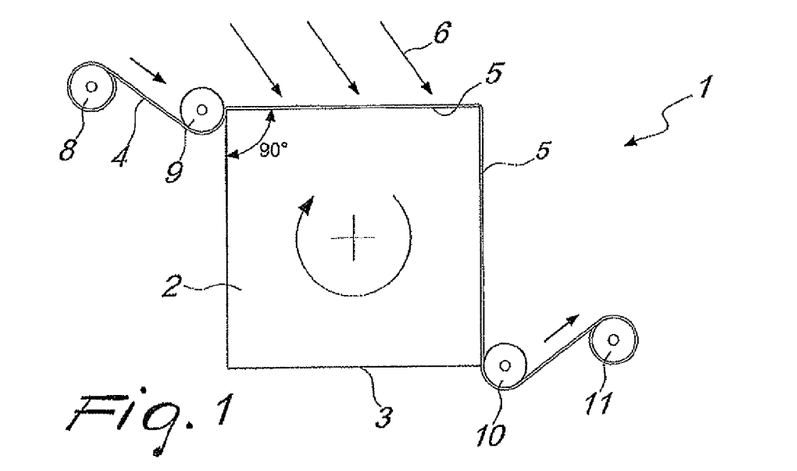
FIG. 1 schematically shows a first embodiment of a device with a square drum.

FIG. 1 is a first embodiment of a device 1 according to the invention which has a polygon drum, here a square drum 2, as the central element. The four planar outer surfaces of the drum 2 are each provided with at least one master hologram and will be termed "master surfaces" in the following. Over these planar master surfaces 3, a holographic film 4 is guided over two subsequent surfaces in such a way that at a specific orientation of the drum, two of the four surfaces are accessible to full exposure to laser beams 6 as "active" master surfaces. During this process, the holographic film which in a well-known manner consists of a carrier foil, a photopolymer layer and a protective foil, is guided by a take-off roller 8 to a lamination roller 9 and applied on the drum in such a way that after removal of the protective foil (not shown), the well contacting adhesive photopolymer layer is firmly brought into contact on the drum and in particular on the masters present thereon, and subsequently performs the corresponding rotational movement together with the drum; in this case, clockwise. The exposed film with the holograms copied into it is then drawn off the drum by a delamination roller 10 arranged nearly diagonally to the lamination roller 9 and wound onto a take-up roller 11, where, however, a protective foil (not shown) is applied on the photopolymer layer before winding up.

To state more precisely, it is pointed out that the "... roller" 8, 9, 10, 11 in each case has the width and length, respectively, of the drum, i.e. is to be understood as a " ... cylinder" and will generally be designated as such in the following.

From this figure, it also becomes clear that a laser exposure 6 over the entire surface can take place either on only one of the two active master surfaces 5 or on both active master surfaces 5 simultaneously.

From FIG. 1, it also becomes clear that with laser exposure in the shown position of the drum 2, horizontally and vertically arranged master surfaces are present. The drum can continuously rotate during exposure or it can stand still (intermittent rotation of the drum), with only one of the two active master surfaces 5, e. g. the upper horizontal surface or both surfaces simultaneously, being able to be exposed to identical copying beams. However, it is also possible to proceed such that on the upper horizontal surface 5, a hologram is copied into the film 4 while at the same time a different, second hologram is copied into the second vertical surface 5. It is possible to copy a hologram mix consisting of two different holograms into the films.

Figure 2:
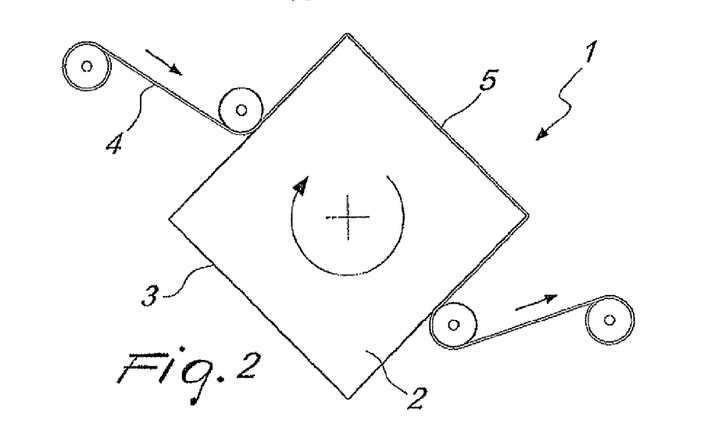
FIG. 2 shows the device in FIG. 1 in a swiveled position of the drum.

FIG. 2 again shows the copying device from FIG. 1, but with the square drum 2 swiveled by 90°. In this figure, it can be seen that only one of the master surfaces 3 can be regarded as an entirely active master surface 5 whereas the two adjacent master surfaces 3 are only partially covered by the film 4. Thus, in this case, only one active master surface 5 could be completely exposed to laser, which, however, is only possible in an embodiment with a continuously rotating drum and an exposure unit swiveling together with the drum, as is shown below in more detail in connection with FIG. 8.

Figure 3:
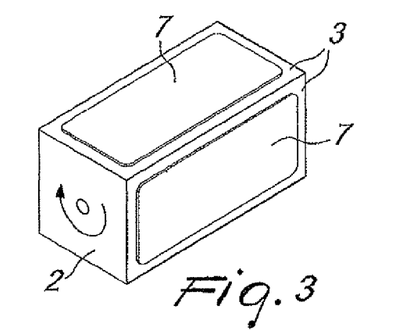
FIG. 3 shows a perspective view of an embodiment of a square drum with one master hologram per master surface.

FIG. 3 shows how on each of the planar master surfaces of the square drum 2, one master hologram 7 is applied, resulting in four master surfaces 3.

Figure 4:
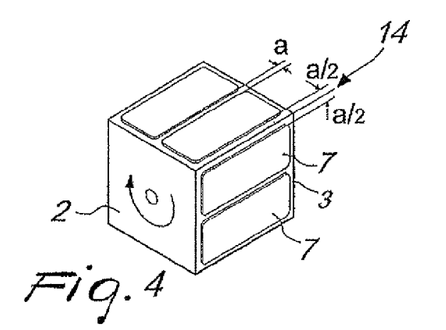
FIG. 4 shows a perspective view of an embodiment of a square drum with two masters hologram per master surface.
Figure 5:
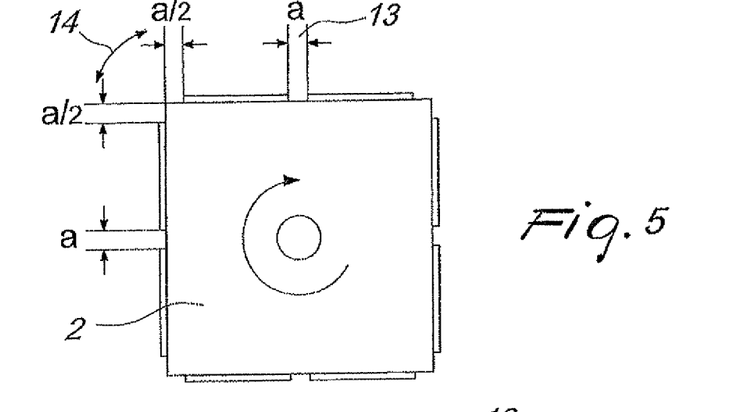
FIG. 5 shows a front cross-sectional view of the drum in FIG. 4.

FIGS. 4 and 5 show how in a further embodiment of a square drum 2, two master holograms 7 are arranged on each master surface 3, succeeding upon each other in the circumferential direction. These masters 7 are precisely spaced from each other in the circumferential direction, i.e. with distances "a", wherein the inner distances 13, i.e. the distances between the masters of one surface, are identical with the outer distances 14, i.e. the distances between the adjacent master holograms 7 of neighboring master surfaces 3, which succeed upon each other over the edges. This identical distance is very important for precise copying of the holograms, but also for further handling and processing of the exposed film by hardening, application on different carrier elements and cutting to size.

Figures 6, 7:
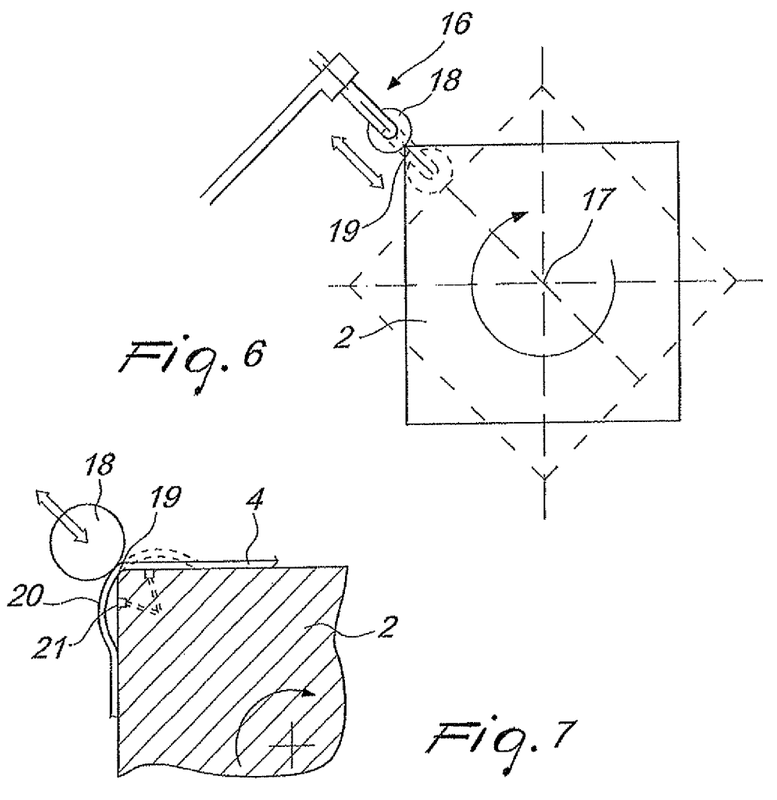
FIG. 6 schematically shows the arrangement of a pressure roller/cylinder at a polygon corner.
FIG. 7 shows the film at a polygon corner with pressing devices.

FIG. 6 shows how a pressing device 16 is assigned to a drum 2. This drum possesses a pressure roller 18 which can be shifted radially to the rotational axis 17 of the drum which is always in close contact with the surface of the drum and provides the necessary pressure for appropriate contact of the film with the drum surface and the master holograms 7 located on it. In the position shown here, the drum, 2 is in linear diagonal arrangement relative to the pressure roller 18, i.e. the roller is located precisely at the polygon corner 19. If the drum is swiveled by 45° (represented by a dashed line), the pressure roller is in its lowest position, at the center of the drum surface. From this it can be seen that the pressure roller always moves with the drum and continuously keeps or brings the film in close contact with the active master surface. The pressure roller can at the same time be the lamination roller 9 (see FIG. 1), or it can additionally be provided at an angle between two active master surfaces to counteract a bulging at the angle which may take place especially with small polygon corner angles of 90° of a square drum, or even at 60° of a triangular drum, depending on the stiffness of the film and/or low adhesiveness of the photopolymer layer.

Such a case of bulging of the film is shown in FIG. 7. It can be seen how the film 4, guided over a 90° corner 19, is detached with relatively strong elasticity to form a bulging 20, which, however, is remedied by the pressure roller 18. In addition, an aspiration device 21 is provided in the polygon corner 19 which is however only shown schematically in the form of channels. Thus, by rolling pressure from the outside, caused by the pressure roller 18, and by the vacuum aspiration force from inside, caused by the aspiration device 21, a constant appropriate contact between the film and the drum can be achieved even over small corner angles.

Figure 8:
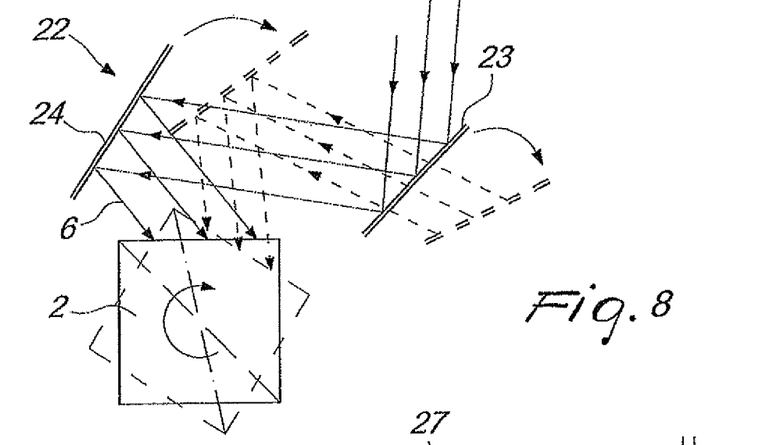
FIG. 8 schematically shows a first embodiment of a drum with an exposure unit.

FIG. 8 shows how with a continuously rotating drum 2, the assigned exposure unit 22 swivels synchronously with the drum, at least section wise, so that laser exposure 6 over the entire surface is present with sufficiently long exposure time and acts on the master and the film, e. g. for at least 0.1 sec for polymer films and in the range of nanoseconds for non-diffusion-dependent films. The exposure unit 22 is equipped, among others, with two mirrors, in this case two planar mirrors 23 and 24, which transmit incident parallel laser beams as such in such a way that coherent laser beams 6 exposing the entire master surface impinge on the master and the film located on it at a predefined reconstruction angle. In addition, the dashed line shows how because of the continuously rotating drum 2 the exposure unit performs a corresponding rotational movement as well, so that at least for the necessary exposure time, the laser beams 6 impinge on the surface to be exposed under identical conditions, in particular with identical incidence angles and in identical positions.

Figure 9:
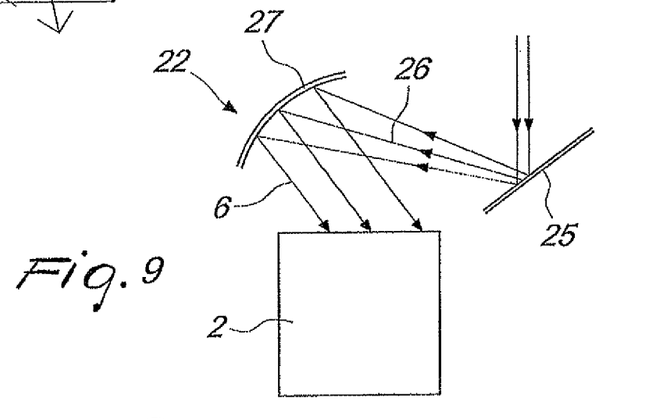
FIG. 9 schematically shows a second embodiment of a drum with an exposure unit.

FIG. 9 shows how the exposure unit 22 can be provided with a different mirror configuration. The first mirror 25 is shaped so that the incident beams are directed at a concave mirror 27 as a divergent beam bundle 26, which concave mirror is shaped and oriented so that parallel coherent radiation impinges on the entire surface of the film 4 (not shown) and of the master hologram 7 located beneath it. Here as well, the entire exposure unit 22 can section wise and synchronously follow the rotational movement of the drum 2. However, it can also be embodied as a stationary unit, with the drum 2 being displaced stepwise by 90° each and halted accordingly for the exposure time, to then be guided back into the initial position.

Figure 10:
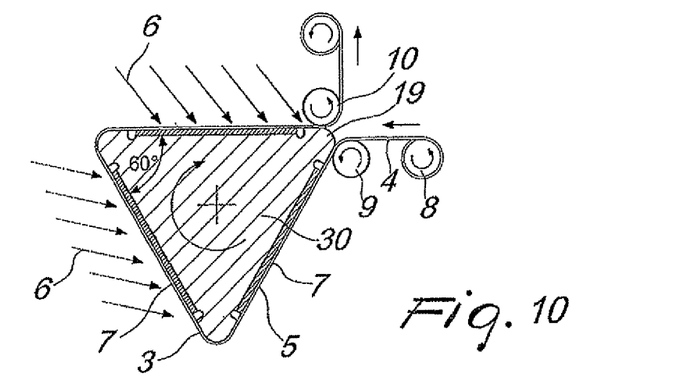
FIG. 10 schematically shows a device with a triangular drum.

FIG. 10 shows a device according to the invention which has a triangular drum 30. Consequently, it has three master surfaces 3 to each of which a master hologram 7 is stretched or attached. Here as well, the film 4 is applied on the drum by a take-off roller 8 via a lamination roller 9, near one of the drum corners 19. The laminated film 4 is guided with contact on all three drum surfaces and is removed from the drum near the polygon corner 19 by a delamination roller 10 and wound onto the take-up roller 11. Since the two rollers 9 and 10 are positioned very close to the corner 19, it is possible to not only expose the entire master surface diagonally opposite to the corner 19 with laser beams 6 but also the two other surfaces forming the corner 19. In this manner, one or two or three holograms can be copied simultaneously, where the drum can perform a rotation by 120°, 240°, or a complete rotation by 360° between the individual exposures, so as to then be halted for the respective copying exposures.

Figure 11:
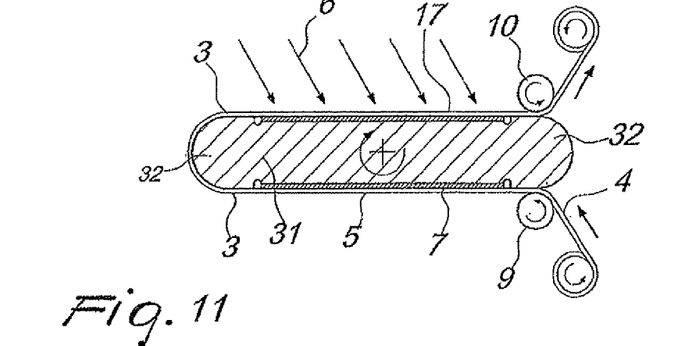
FIG. 11 schematically shows a device with a flat rectangular drum.

FIG. 11 shows a device according to the invention which has a flat rectangular drum 31. This drum has two planar master surfaces 3 which are parallel to each other and provided with one master hologram 7 each, whereas the narrow sides are embodied as semicircular roundings 32. Here, feeding and removal of the film 4 by the rollers 9 and 10 also takes place on the outside at one of the rounded flat sides, so that two active master surfaces are present. Due to the fact that the rounding 32 has a very large radius, the film 4 guided over it can also be kept in very close contact with all active surfaces of the drum 31. It can be seen that here as well, either one surface can be exposed to laser at a time or both surfaces simultaneously. In the first case, with intermittent rotation of the drum 31, one rotation of 180° at a time with subsequent full exposure of the master surface is to be performed, whereas in the second case, a complete rotation of the drum by 360° must be performed, with subsequent simultaneous full exposure of both master surfaces.

Figure 12:
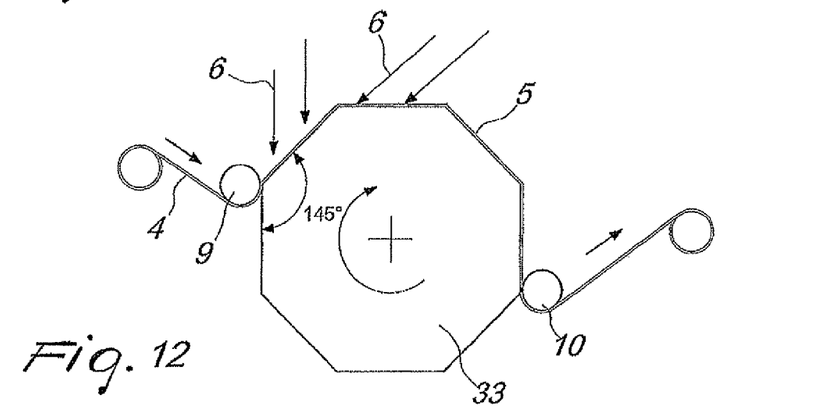
FIG. 12 schematically shows a device with an octangular drum.

FIG. 12 shows a device according to the invention having an octagon drum 33, where via a lamination roller 9 and a delamination roller 10, the holographic film 4 is applied in close contact to the drum and discharged from it, such that the film contacts four polygon surfaces at the same time, resulting in four successive active master surfaces. Thus, it is possible to expose all four surfaces individually or simultaneously or, for instance, two at a time. It is possible for the drum 33 not to bear eight identical master holograms but, for instance, two or more different masters so that several different holograms can be copied into the film at the same time. In this way, a very economical operation of the highly productive device is possible. Here as well, there is the possibility of stepwise rotation by only one or by two, three or all eight splitting angles at the same time with a respective subsequent complete exposure.

Figure 13:
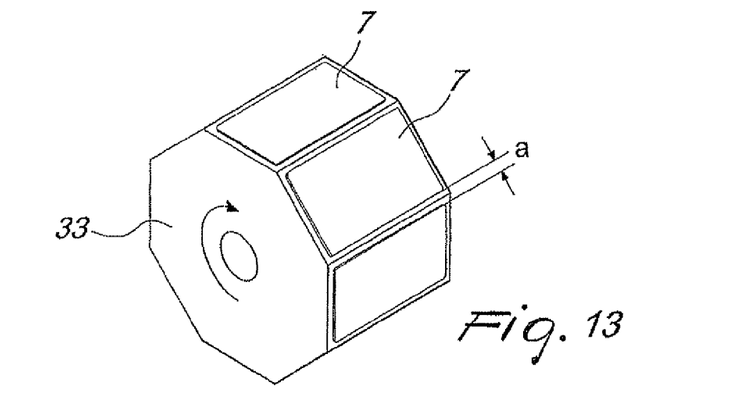
FIG. 13 shows a perspective view of the drum of the device according to FIG. 12.

FIG. 13 shows the drum 33 of the device according to FIG. 12 and how its planar polygon surfaces are each provided with a master hologram 7. Here as well, the master holograms 7 are arranged on the master surfaces in such a way that the distances "a" between adjacent master holograms are identical.

Figures 14, 15, 16:
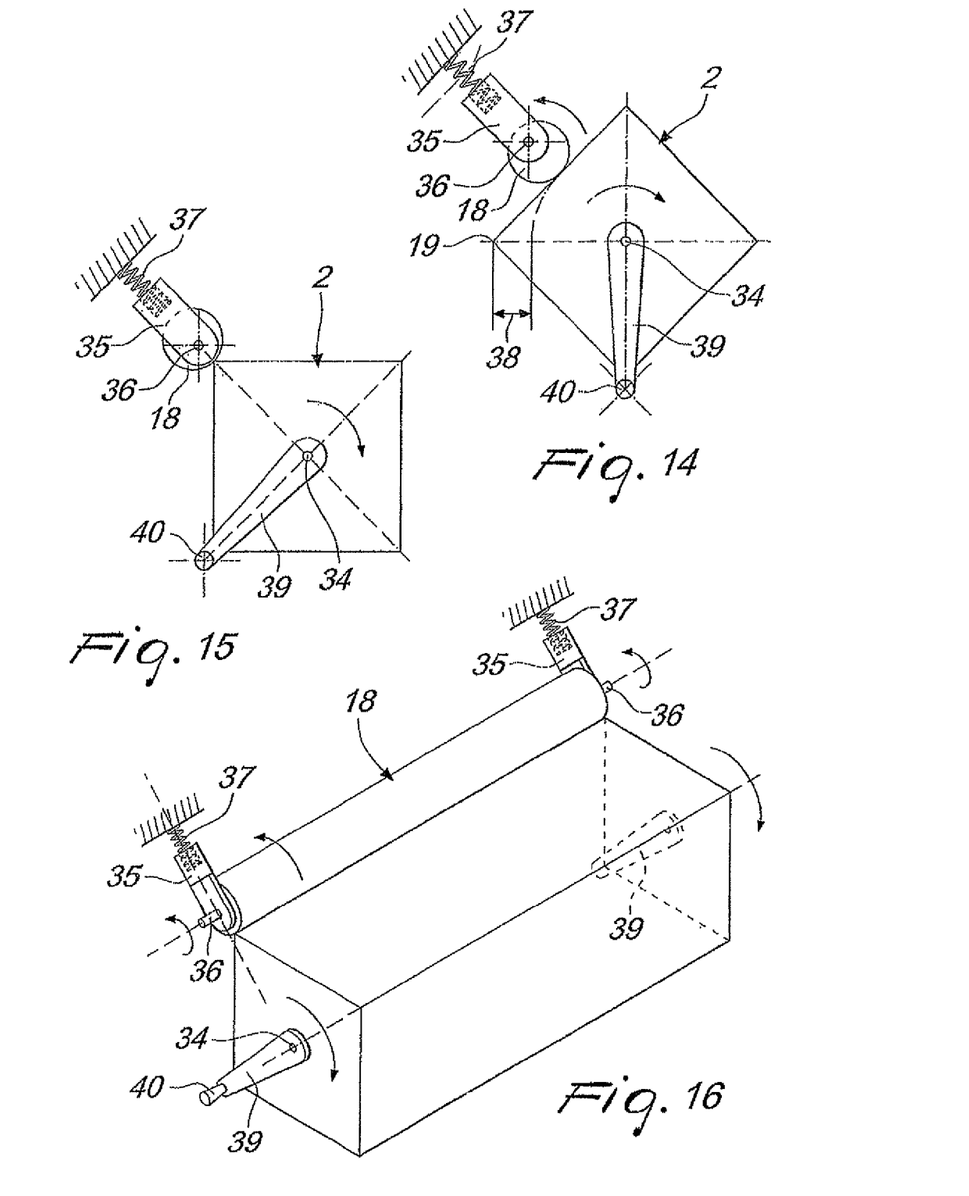
FIG. 14 shows a front view with a pressing device similar to the one in FIGS. 6 and 7.
FIG. 15 shows the device in FIG. 14 in a position rotated by 45°.
FIG. 16 is a perspective view of the device in FIGS. 14+15.

Finally, FIGS. 14 through 16 show another embodiment and method of operation of a pressure device 16. Its pressure cylinder 18 is namely mounted eccentrically in one respective carrier arm 35 at both ends, wherein a respective eccentric bolt 36 protrudes coaxially with the eccentric rotational axis of the pressure cylinder 18 from the carrier arms on the front side. The carrier arms 35 are pressed in the direction of the rotational axis of the drum 2 (radially) by a pressure spring 37.

FIG. 14 shows the pressure cylinder 18 in a position at the center of one side of the square drum 2, i.e. in a position next to the axis of rotation 34. The pressure cylinder 18 is in its eccentrically anterior or advanced position. The circular arc shown as a dashed line indicates the path length difference or the stroke 38 in relation to the largest distance of the polygon corner 19 from the central rotational axis 34 of the drum.

In addition, it can be seen how a respective lever 39 is fastened to the front side of the drum, at the remotest end of which a lifting roller 40 is arranged. This roller is arranged so as to interact with the respective eccentric bolt 36 with each rotation of the drum, lifting the pressure cylinder 18 and compensating for the circular tolerance.

FIG. 15 shows a position of the drum 2 displaced by 45° wherein the pressure cylinder 18 touches the polygon corner 19 and points at the diagonal. The pressure cylinder 18 is in its position which is eccentrically lifted and thus highest in relation to the rotational axis 34 of the drum. A comparison of FIGS. 14 and 15 shows that the compensating radial movement is substantially performed by the eccentrically configured pressure cylinder 18 only whereas the carrier arms 35 do not have to perform any stroke. Therefore, the pressure of the springs on the carrier arms and thus on the cylinder 18 and on the holographic film via the cylinder is always constant.

FIG. 16 illustrates a drum position as in FIG. 15, where both mountings or resilient carrier arms 35, respectively, at the ends of the pressure cylinder 18 and both face side levers 39 with their lifting rollers 40 and the effect of the same are shown.

LIST OF REFERENCE NUMBERS 1. device
2. square drum
3. master surface
4. holographic film
5. active master surface
6. laser beam (exposure)
7. master (hologram)
8. take-off roller (cylinder)
9. lamination roller (cylinder)
10. delamination roller (cylinder)
11. take-off roller (cylinder)
12. - - -
13. inner distance
14. outer distance
15. - - -
16. pressing unit
17. rotational axis
18. pressing roller (cylinder)
19. polygon corner
20. bulging
21. aspiration device
22. exposure unit
23. mirror
24. mirror
25. mirror
26. divergent radiation
27. concave mirror
28. - - -
29. - - -
30. triangular drum
31. rectangular drum 32. rounding
33. octagon drum
34. rotational axis (center)
35. carrier arm
36. eccentric bolt
37. pressure spring
38. stroke
39. lever
40. lifting roller
"a" circumferential distance

The invention claimed is:

1. Method for producing contact copies of reflection volume holograms on a holographic film, the method comprising:
guiding the film over a rotating drum with a polygonal cross-section, where at least two planar master surfaces are present on the drum, to each of which one master hologram is attached, and;
moving the planar master surfaces through or into an exposure area together with the master hologram,
subjecting the film and the master hologram in the exposure area to at least one laser exposure to reproduce the master hologram in the photosensitive layer of the film,
attaching the film to the drum with a pressure device;
rotating the drum constantly, with at least one polygon surface or master surface at a time with the master hologram attached to it being located in the exposure area, wherein the at least one laser exposure is a coherent parallel radiation over the complete or entire surface which takes place over at least part of: the entire master surface, the surface of the respective master holograms of a master surface, or plural master surfaces at the same time,
where the at least one laser exposure follows, section wise, the rotational movement of the drum with a speed equal to a rotational speed of the drum in such a manner that the laser exposure over the entire surface is present for a sufficiently long exposure time to reproduce the master hologram in the photosensitive layer and acts on the master and the film; and
resetting the laser exposure into an initial or starting position and performing the same rotational movement and exposure together with the next master surface.

2. Method according to claim 1, further comprising:
exposing one or more master surfaces to laser two-dimensionally at the same time.

3. Method according to claim 2, further comprising a step of copying a hologram mix consisting of two different holograms, the step comprising:
copying a hologram into the film on an active master surface, while at the same time copying a second, different hologram on a second master surface.

4. Method according to claim 1, characterized in that the pressure device works to cause a close adhesion of the film at the polygon corners by means of mechanically, electrically, or magnetically operated pressure rollers or cylinders, or by pressure rollers or cylinders actuated by a combination of the foregoing, acting from the outside, and
mounting the pressure rollers or cylinders eccentrically so that radial stokes are compensated for and a constant pressing force is present, where the pressure rollers or cylinders are lifted after each rotation of the drum for compensation of circular tolerances; and/or
by means of a vacuum of an aspiration device acting from the inside.

5. Method according to claim 1, characterized in that an exposure source of the laser exposure is an exposure unit which has a mirror and is displaced with an angular velocity equal to an angular velocity of the drum.

6. Method according to claim 5, further comprising:
guiding the laser beams over a first mirror as divergent radiation onto a concave mirror and from the concave mirror as parallel radiation onto the active master surface at a respective copying angle;
providing the exposure unit with two deflecting mirrors which relay the parallel radiation onto the active master surface at a respective copying angle.

7. Device for performing the method according to claim 1, having
a drum with a polygonal cross-section with at least two planar master surfaces for entraining a holographic film and for making the film contact a master reflection hologram attached to the master surface,
at least one exposure unit which directs laser beams onto the entire master surface,
a drive mechanism for simultaneous movement of the master hologram and the film together through a laser exposure area in which the film and the master hologram are exposed to laser for reproducing the master hologram in the holographic film,
and a pressure device for close adhesion of the film to the drum being present, characterized in that
to at least one of the active master surfaces with the film guided over it a laser exposure unit is assigned which allows complete exposure of the respective master surface to coherent laser beams,
the drive mechanism of the drum is designed for constant rotation, where the at least one exposure unit follows the rotational movement of the drum section wise, each exposure unit having a rotational speed equal to a rotational speed of the drum, and fully exposes thereby the entire corresponding master surface to then be reset again into an initial or starting position and perform the rotational movement displacement and exposure together with the next master surface.

8. Device according to claim 7, characterized in that the polygon drum is either:
a rectangular drum with a rectangle, with two master surfaces, wherein the film is guided over at least the two master surfaces; or
a polygon drum with n corners having a corresponding number of master surfaces, where the film is guided over at least two to n−1 master surfaces, wherein n≥3.

9. Device according to claim 7, characterized in that to each of the master surfaces, two or more master holograms are attached in the circumferential direction and in that the circumferential distances between the master holograms of one surface and the distances between the masters of adjoining master surfaces are identical over corners of the polygon.

10. Device according to claim 7, characterized in that there is provided a pressing device with mechanically, pneumatically, hydraulically, electrically, or magnetically operated pressure cylinders, or pressure cylinders operated by a combination of the foregoing which are operative from the outside, and/or there is provided an aspiration device with a vacuum which is operative from the inside.

11. Device according to claim 10, characterized in that the pressure cylinder, which is maintained pressed by carrier arms at the ends with pressure springs, is mounted eccentrically so that the radial strokes of the polygon drum are compensated for and a constant application pressure is achieved, and in that at the front side of the drum, revolving with it, one lever, with a lifting roller at the end, is provided, which is designed, for cooperation with lateral eccentric bolts of the pressure cylinders, in such a way that with each rotation of the drum, the pressure roller is lifted, compensating for a circular tolerance.

12. Device according to claim 7, characterized in that the exposure unit comprises at least one deflecting mirror, wherein the exposure unit itself cannot be swiveled but the at least one deflecting mirror can be swiveled so that with a continuously rotating drum, a corresponding swiveling movement of the laser exposure with an identical angular velocity can be performed.

13. Device according to claim 12, characterized in that the exposure unit comprises at least one last mirror which delivers parallel laser beams for master exposure, and where if two mirrors are present, a first mirror delivers divergent radiation and a second mirror is a concave mirror which transforms this radiation into parallel radiation.

14. Device according to claim 7, characterized in that the master drum is embodied as a magnetic drum or a drum equipped with magnetic elements.

* * * * *